United States Patent
Miyauchi et al.

(10) Patent No.: US 7,495,869 B2
(45) Date of Patent: Feb. 24, 2009

(54) MAGNETORESISTIVE EFFECT ELEMENT HAVING HARD MAGNETIC FILMS IN NON-UNIFORM CROSS-SECTIONAL SHAPE

(75) Inventors: Daisuke Miyauchi, Tokyo (JP); Kazuki Sato, Tokyo (JP); Takayasu Kanaya, Tokyo (JP)

(73) Assignee: TDK Corporation, Chuo-ku, Tokyo (JP)

( * ) Notice: Subject to any disclaimer, the term of this patent is extended or adjusted under 35 U.S.C. 154(b) by 351 days.

(21) Appl. No.: 11/225,016

(22) Filed: Sep. 14, 2005

(65) Prior Publication Data

US 2006/0056117 A1    Mar. 16, 2006

(30) Foreign Application Priority Data

Sep. 15, 2004   (JP)   ............... 2004-268338

(51) Int. Cl.
G11B 5/39       (2006.01)
G01R 33/02      (2006.01)

(52) U.S. Cl. ............... 360/324.12; 324/207.21

(58) Field of Classification Search ............ 360/324.12; 324/252, 207.21; 338/32 H
See application file for complete search history.

(56) References Cited

U.S. PATENT DOCUMENTS

| | | | | |
|---|---|---|---|---|
| 5,608,593 A * | 3/1997 | Kim et al. | ............... | 360/324.12 |
| 5,959,810 A * | 9/1999 | Kakihara et al. | ........ | 360/324.12 |
| 5,995,338 A * | 11/1999 | Watanabe et al. | ...... | 360/324.12 |
| 6,118,624 A * | 9/2000 | Fukuzawa et al. | ...... | 360/324.12 |
| 6,122,151 A * | 9/2000 | Saito et al. | ............. | 360/324.12 |
| 6,185,078 B1 * | 2/2001 | Lin et al. | ............... | 360/324.12 |
| 6,198,608 B1 * | 3/2001 | Hong et al. | ................... | 360/320 |
| 6,262,869 B1 * | 7/2001 | Lin et al. | ............... | 360/324.11 |
| 6,353,318 B1 * | 3/2002 | Sin et al. | .................... | 324/252 |
| 6,385,017 B1 * | 5/2002 | Min et al. | .............. | 360/324.12 |
| 2001/0026423 A1 * | 10/2001 | Arai et al. | .................... | 360/321 |
| 2002/0064005 A1 * | 5/2002 | Arasawa et al. | ........ | 360/324.12 |
| 2002/0071224 A1 * | 6/2002 | Tagawa et al. | ........... | 360/327.3 |
| 2002/0085323 A1 * | 7/2002 | Smith et al. | ............ | 360/324.12 |
| 2002/0109948 A1 * | 8/2002 | Yamada et al. | ......... | 360/324.12 |

(Continued)

FOREIGN PATENT DOCUMENTS

JP    2002-151756    5/2002

(Continued)

Primary Examiner—Brian E Miller
(74) Attorney, Agent, or Firm—McGinn IP Law Group, PLLC

(57) ABSTRACT

A magnetoresistive effect sensor includes a pinned layer, a nonmagnetic spacer layer, and a free layer having a total thickness of at least 10 nm. The sensor has insulating films disposed on both side surfaces of the spin valve film. The sensor has hard magnetic films disposed on the insulating films for applying a biasing magnetic field to the free layer. Each hard magnetic film extends toward the free layer in a vicinity of the spin valve film, such that as each hard magnetic film extends toward the spin valve film, a cross-sectional area thereof in a plane perpendicular to the layer width direction becomes progressively smaller. Each hard magnetic film has, in a plane parallel to the air bearing surface, a first boundary line which at least partially faces the free layer and substantially defines an end point of the hard magnetic film in the layer width direction.

9 Claims, 7 Drawing Sheets

U.S. PATENT DOCUMENTS

| | | |
|---|---|---|
| 2002/0163766 A1 | 11/2002 | Eguchi et al. |
| 2003/0035254 A1 | 2/2003 | Furukawa et al. |
| 2003/0053269 A1* | 3/2003 | Nishiyama ............... 360/324.1 |
| 2003/0058587 A1* | 3/2003 | Hasegawa et al. ...... 360/324.12 |
| 2003/0174446 A1* | 9/2003 | Hasegawa ................... 360/319 |
| 2004/0008455 A1* | 1/2004 | Hasegawa et al. ...... 360/324.12 |
| 2004/0117976 A1* | 6/2004 | Sato et al. ................ 29/603.04 |
| 2004/0252417 A1* | 12/2004 | Hasegawa et al. ...... 360/324.11 |
| 2004/0257721 A1 | 12/2004 | Furukawa et al. |
| 2005/0018363 A1* | 1/2005 | Hasegawa et al. ........ 360/324.1 |
| 2005/0231856 A1* | 10/2005 | Kao et al. .............. 360/324.11 |
| 2006/0067010 A1* | 3/2006 | Kagami et al. ........... 360/324.1 |
| 2007/0252588 A1* | 11/2007 | Nishiyama ............. 324/207.21 |

FOREIGN PATENT DOCUMENTS

| | | |
|---|---|---|
| JP | 2002-299726 | 10/2002 |
| JP | 2002-329905 | 11/2002 |
| JP | 2003-86860 | 3/2003 |
| JP | 2003-283002 | 10/2003 |
| JP | 2004031838 A * | 1/2004 |
| JP | 2004-152334 | 5/2004 |

* cited by examiner

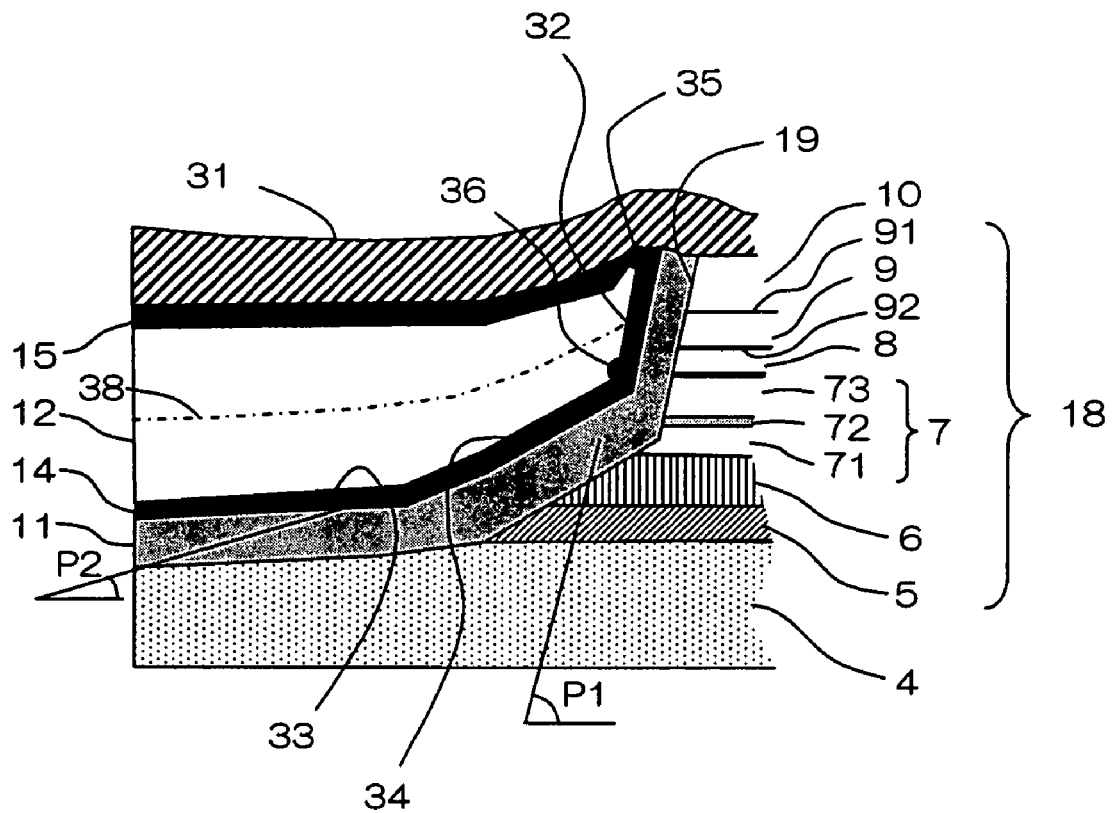
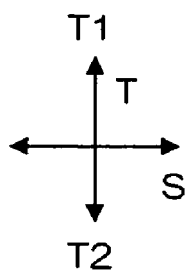

MAGNETORESISTIVE EFFECT ELEMENT HAVING HARD MAGNETIC FILMS IN NON-UNIFORM CROSS-SECTIONAL SHAPE

BACKGROUND OF THE INVENTION

1. Field of the Invention

The present invention relates to a magnetoresistive effect sensor, a thin-film magnetic head, a head gimbal assembly, and a hard disk device, and more particularly to a magnetoresistive effect sensor for use in a thin-film magnetic head of a magnetic recording device such as a hard disk device etc.

2. Description of the Related Art

Magnetic heads employing a GMR (Giant Magneto-Resistive) sensor as a reproducing sensor have been widely used in high-density magnetic recording applications. In particular, a GMR sensor which employs a spin valve film (hereinafter referred to as an SV film) exhibits a high ratio of resistance change to sense current that flows through the GMR sensor in order to read information recorded in a recording medium. It is therefore possible for a GMR sensor to provide a magnetic head of higher sensitivity. An SV film is a stacked layer structure comprising a ferromagnetic layer having a fixed magnetic orientation (hereinafter referred to as pinned layer), a ferromagnetic layer having a variable magnetic orientation depending on an external magnetic field that is generated by a recording medium (hereinafter referred to as a free layer), and a nonmagnetic spacer layer sandwiched between the pinned layer and the free layer. The external magnetic field is also called a signal magnetic field hereinafter.

In general, the SV film utilizes the characteristic that an electron having a spin in the same direction as the magnetic orientation freely moves through the SV film, while an electron having a spin in the opposite direction is scattered and cannot move through the SV film. The relative angle of magnetic orientation between the free layer and the pinned layer changes due to the change in magnetic orientation of the free layer that is induced by a signal magnetic field applied from a recording medium. As a result, the spin-dependent scattering of conductive electrons changes depending on the relative angle, causing change in magnetoresistance. The magnetic head detects this change in magnetoresistance so that it reads the magnetic information from the recording medium. Therefore, it is important to provide a sufficiently high ratio of change in magnetoresistance in order to enhance the reproduction sensitivity of a magnetic head.

A magnetic field (biasing magnetic field) is applied to the free layer in one direction at all times from hard magnetic films which are disposed on lateral sides of the free layer. The intensity of the magnetic field is set such that when the free layer is not subjected to a signal magnetic field, it is magnetized in a certain orientation or in a single magnetic domain, and when the free layer is subjected to a signal magnetic field, the magnetic orientation is rotated at certain angles. This allows a simultaneous change in the magnetic orientation of the entire free layer and a resultant high ratio of change in magnetoresistance. Setting the biasing magnetic field to an appropriate level also contributes to the harmonization between a high ratio of change in magnetoresistance and linearity/low-noise characteristics of the change in magnetoresistance with respect to the change in the external magnetic field. The latter is the characteristics to suppress Barkhausen noise, or the change in magnetization in sawteeth steps with respect to the magnetic field intensity. To maximize such an effect, the hard magnetic films are preferably disposed as closely and laterally to the free layer as possible, thereby applying the magnetic field efficiently to the free layer from the hard magnetic films. Such structures are disclosed in Japanese Patent Laid-open Publication No. 2002-329905 (Document 1), Japanese Patent Laid-open Publication No. 2002-151756 (Document 2), and Japanese Patent Laid-open Publication No. 2003-86860.

Conventionally, CIP (Current In Plane)—GMR sensors, which employ an SV film in which sense current flows parallel to the film planes, have been commonly used as MR sensors. Recently, efforts have been made to develop CPP (Current Perpendicular to the Plane)—GMR sensors in which sense current flows perpendicularly to the film planes to realize higher-density magnetic recording. CPP-type sensors include a TMR sensor employing a TMR (Tunnel Magneto Resistive) sensor. However, a CPP-GMR sensor is thought to be highly promising due to its potential, because it has lower resistance than a TMR sensor, and higher output than a CIP-GMR sensor for narrow track widths.

However, since the sense current flows perpendicularly to the film planes, i.e., the film boundaries, it is difficult for CPP-GMR sensors to obtain sufficient spin-dependent scattering at the film boundaries, which may lead to insufficient change in magnetoresistance. To cope with this drawback, attempts have been made to increase the thicknesses of the free layer and the pinned layer in order to increase the resistance due to the scattering of conductive electrons in each layer, i.e., bulk scattering, and in order to increase the absolute value of magnetoresistance, thereby obtaining a high ratio of change in magnetoresistance.

FIG. 1 shows the conventional magnetoresistive effect sensor of a CPP-GMR type in a partial cross section. CPP-GMR sensor 102 has buffer layer 5, anti-ferromagnetic layer 6, pinned layer 7, nonmagnetic spacer layer 8, free layer 9, and cap layer 10 which are deposited in this order on lower electrode/shield layer 4. The layers from buffer layer 5 to cap layer 10 are collectively called SV film 18. Pinned layer 7, nonmagnetic spacer layer 8, and free layer 9 preferably have a thickness of at least 10 nm (100 Å) in total for the reason described above. Both sides of SV film 18 are covered with insulating films 111. Hard magnetic films 112 which apply a biasing magnetic field to free layer 9 are disposed on the outer sides of insulating films 111. Upper electrode/shield layer 3 is disposed such that it fully covers hard magnetic films 112 and SV film 18.

The steps for fabricating a magnetoresistive effect sensor which includes a SV film will be now briefly described. SV film 18 is first deposited, then a resist (not shown) is formed over SV film 18. Insulating films 111 and hard magnetic films 112 are formed on both sidewalls of SV film 18. Since a CPP-GMR sensor has a large film thickness, hard magnetic films 112 are formed such that they rise along the sidewalls of SV film 18 toward end the portions that project from SV film 18. Such a configuration is rarely formed for a thin SV film. Instead, as shown in FIG. 2, hard magnetic films 112b are formed substantially flush with SV film 18, and the end portions do not project from SV film 18.

In a CPP-GMR sensor, however, it is difficult to form such a SV film configuration as shown in FIG. 2, because the SV film needs to be formed in a rather larger thickness. The hard magnetic films, on the contrary, are usually formed such that the end portions project upwardly as shown in FIG. 1. In hard magnetic films that have such a structure, the magnetic field generated by the hard magnetic films is not directed toward the free layer, but towards the upper electrode/shield layer, and fails to the apply biasing magnetic field effectively to the free layer. This makes it difficult to increase the reproduced output level and to obtain a linear magnetic response to the signal magnetic field. In addition, the magnetic characteristics of the upper electrode/shield layer are adversely affected.

These drawbacks cannot be resolved by the above-disclosed conventional techniques. According to Documents 1 and 2, block-like hard magnetic films are disposed on lateral sides of a free layer. However, it becomes more difficult to form such a structure as the thickness of the SV film increases. It may be effective to increase the thickness of the hard magnetic films in order to reduce the projection above the SV film, which, however, tends to apply an excessive biasing magnetic field, resulting in a reduction in the reproduced output level. Disposing hard magnetic films only around a free layer, as disclosed in Document 3, may result in an insufficient biasing magnetic field due to the insufficient thickness.

SUMMARY OF THE INVENTION

It is an object of the present invention to provide a magnetoresistive effect sensor of the CPP-GMR type having a large film thickness, which allows a high ratio of change in magnetoresistance to increase the reproduced output level, as well as to improve linear magnetic response to a signal magnetic field.

A magnetoresistive effect sensor according to the present invention comprises a spin valve sensor disposed on a substrate layer. The spin valve sensor has a stacked layer structure which includes a pinned layer having a fixed magnetic orientation against an external magnetic field, a nonmagnetic spacer layer, and a free layer having a variable magnetic orientation which depends on the external magnetic field. Sense current flows through the pinned layer, the nonmagnetic spacer layer, and the free layer substantially in a stacked direction thereof. The pinned layer, the nonmagnetic spacer layer, and the free layer have a total thickness of at least 10 nm. The sensor has insulating films disposed on both side surfaces of the spin valve sensor in a layer width direction, the layer width direction being parallel to an air bearing surface and perpendicular to the stacked direction. The sensor further has hard magnetic films disposed on the insulating films for applying a biasing magnetic field to the free layer. Each hard magnetic film extends toward the free layer in a vicinity of the spin valve sensor, such that as each hard magnetic film extends toward the spin valve sensor, a cross-sectional area thereof in a plane perpendicular to the layer width direction becomes progressively smaller. Each hard magnetic film has, in a plane parallel to the air bearing surface, a first boundary line which at least partially faces the free layer and substantially defines an end point of the hard magnetic film in the layer width direction.

In such a magnetoresistive effect sensor, the magnetic field generated by the hard magnetic films is less apt to leak upwardly in the stacked direction beyond the first boundary line. Since the hard magnetic films extend toward the free layer ending at the end points that are each disposed substantially on the lateral side of the free layer, the magnetic field that is generated by and flows in the hard magnetic films is applied efficiently to the free layer. Furthermore, since the hard magnetic films extend toward the spin valve film such that the cross-sectional areas of the hard magnetic films in a plane perpendicular to the layer width direction become progressively smaller toward the spin valve sensor, the hard magnetic films can be formed in a sufficient thickness in areas remote from the spin valve sensor, so that a sufficient magnetic field can be generated in those areas. In the vicinity of the spin valve sensor, the magnetic field that is generated from hard magnetic layers is concentrated on the free layer.

Each first boundary line may have an upper end in the stacked direction, the upper end defining an upper crest of the hard magnetic film in the stacked direction.

Each hard magnetic film may have a second boundary line which faces the substrate layer in the plane parallel to the air bearing surface; and a third boundary line which faces the side surface of the spin valve film and interconnects the first and second boundary lines.

The first boundary line may have an upper end which lies above an upper surface of the free layer in the stacked direction, and a bent point which lies between the first boundary line and the third boundary line, the bent point lying below a lower surface of the free layer in the stacked direction.

Each hard magnetic film may extend toward the free layer, such that as a center of gravity of the hard magnetic film in the plane perpendicular to the layer width direction approaches the spin valve film, each hard magnetic film extends upwardly in the stacked direction toward the free layer.

The magnetoresistive effect sensor may further comprise base films which are disposed between the hard magnetic films and the insulating films.

A head gimbal assembly according to the present invention has a slider including the above-described thin-film magnetic head, disposed opposite to the recording medium, and a suspension for resiliently supporting the slider.

A hard disk device according to the present invention has a slider including the above-described thin-film magnetic head, disposed opposite to a disciform recording medium driven to rotate, and a positioning device for supporting the slider and positioning the slider relative to the recording medium.

According to the present invention, a magnetoresistive effect sensor of a CPP-GMR type having a large film thickness can be provided which exhibits a high ratio of change in magnetoresistance to increase reproduced output level, as well as enhanced linear magnetic response to a signal magnetic field.

The above and other objects, features, and advantages of the present invention will become apparent from the following description with reference to the accompanying drawings which illustrate examples of the present invention.

BRIEF DESCRIPTION OF THE DRAWINGS

FIG. 5 is a partial enlarged side view of the magnetoresistive effect sensor shown in FIG. 4;

DESCRIPTION OF THE PREFERRED EMBODIMENT

A magnetoresistive effect sensor, hereinafter referred to as CPP sensor 2, according to the present invention will be described with reference to the drawings.

Figure 3:
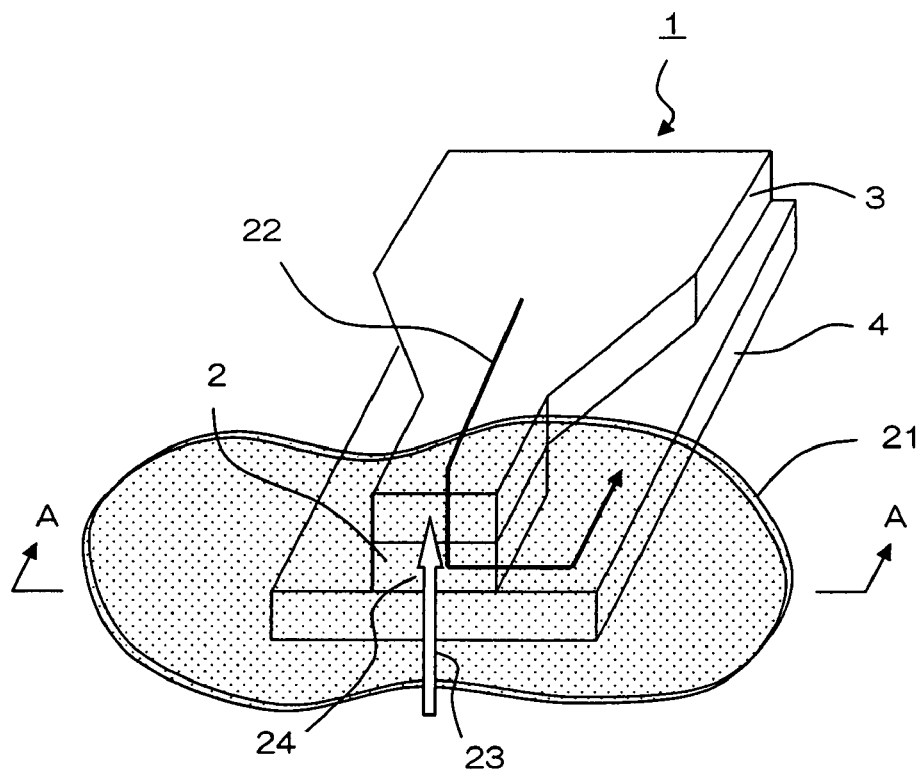
FIG. 3 is a perspective view of a thin-film magnetic head incorporating a magnetoresistive effect sensor according to the present invention.

FIG. 3 shows thin-film magnetic head 1 incorporating a magnetoresistive effect sensor according to the present invention in a perspective view. Thin-film magnetic head 1 may be a read-only head or an MR/inductive composite head which has a read head portion and a write head portion. CPP sensor 2 is sandwiched between upper electrode/shield layer 3 and lower electrode/shield layer 4, with an end portion facing recording medium 21. The end portion of CPP sensor 2 defines a part of air bearing surface 24. As indicated by the solid arrow in FIG. 3, sense current 22 flows from upper electrode/shield layer 3 through CPP sensor 2 to lower electrode/shield layer 4 under a voltage applied between upper electrode/shield layer 3 and lower electrode/shield layer 4. The signal magnetic field of recording medium 21 in a region opposite to CPP sensor 2 changes as recording medium 21 moves in medium rotating direction 23 indicated by the white arrow. CPP sensor 2 detects the change in the signal magnetic field as an electric resistance change of sense current 22 which is caused by the GMR effect, and thereby reads magnetic information written in each magnetic domain of recording medium 21.

Figure 4:
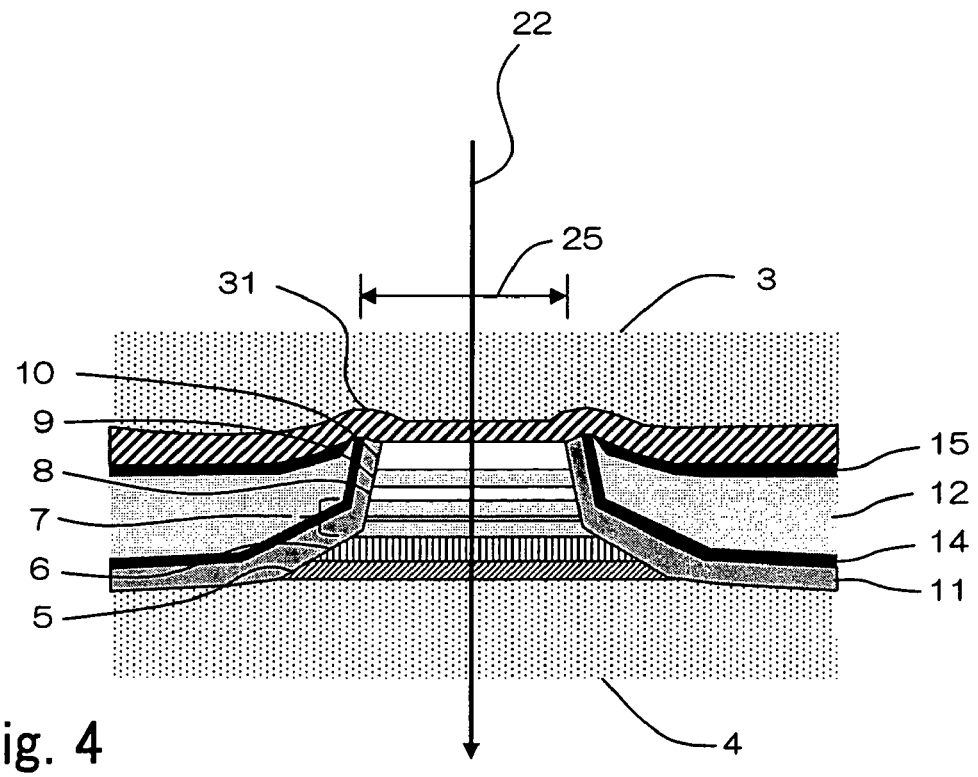
FIG. 4 is a side view of the magnetoresistive effect sensor shown in FIG. 3 as viewed from an air bearing surface.

FIG. 4 shows CPP sensor 2 in a side view, and FIG. 5 shows the left half portion of CPP sensor 2 in an enlarged side view, each seen from line A-A in FIG. 3. These figures show the stacked layer structure of CPP sensor 2 as viewed from air bearing surface 24.

CPP sensor 2 has buffer layer 5, anti-ferromagnetic layer 6, pinned layer 7, nonmagnetic spacer layer 8, free layer 9, and cap layer 10, which are deposited in this order on lower electrode/shield layer 4. Upper electrode/shield layer 3 is disposed on cap layer 10, with upper electrode base layer 31 sandwiched therebetween. The layers from buffer layer 5 to cap layer 10 are collectively called SV film 18. SV film 18 has width 25, usually set to 0.1 µm or less, which defines a reproducing track width. In this specification, a stacked layer structure may be indicated in the form of A/B/(C/D)x/E/F, for example, where x represents an integer. If x=2, then a stacked layer structure consists of layer A, layer B, layer C, layer D, layer C, layer D, layer E, and layer F that are stacked in this order. Each of the layers now will be described in detail.

Upper electrode/shield layer 3 and lower electrode/shield layer 4 each have a NiFe layer which is deposited by plating. Lower electrode/shield layer 4 also functions as a substrate layer for SV film 18.

Buffer layer 5 may have a Ta/NiFeCr layer. Anti-ferromagnetic layer 6 may have an IrMn layer.

As shown in detail in FIG. 5, pinned layer 7 is a so-called synthetic pinned layer in which first pinned layer 71 and second pinned layer 73 are anti-ferromagnetically coupled to each other, with nonmagnetic spacer layer 72 sandwiched therebetween. First pinned layer 71 may be made of CoFe, and nonmagnetic spacer layer 72 may be made of Ru. Second pinned layer 73 may be made of CoFe or may have a stacked layer structure of CoFe/(Cu/CoFe)x. The Cu layer(s) is inserted in second pinned layer 73 in order to increase the number of boundaries between CoFe and Cu so that the boundary scattering effect is increased, thereby obtaining larger magnetoresistive effect. First pinned layer 71 is also formed in a large thickness to equalize the magnetization of layer 73 with that of layer 71. Pinned layer 7 has a thickness in the range from 3 to 7 nm, or more if desired, to obtain a larger bulk scattering effect. This thickness is considerably larger as compared with a CIP-GMR sensor. Pinned layer 7 is not limited to the synthetic pinned layer provided that the magnetic orientation can be fixed to one direction.

Nonmagnetic spacer layer 8 has a Cu layer and has a thickness in the range from 1.5 to 3.5 nm.

Free layer 9 is a layer in which the magnetic orientation changes depending on the signal magnetic field generated by the recording medium. Free layer 9 may have a stacked layer structure of CoFe/NiFe or CoFe/NiFe/CoFe/Cu/CoFe/NiFe/CoFe. Free layer 9 also has a relatively large thickness in order to increase the bulk scattering effect and thereby to obtain a larger ratio of change in magnetoresistance. Each CoFe layer and each NiFe layer has a thickness in the range from 0.5 to 2 nm, and the Cu layer has a thickness in the range from 0.1 to 0.3 nm. The total thickness of free layer 9 is preferably in the range from 3 to 7 nm, which is considerably larger as compared with a CIP-GMR sensor.

Cap layer 10, made of materials such as Ru, is provided to prevent deterioration of the stacked structure.

Table 1 shows an example of the stacked layer structure of CPP sensor 2, in which the composition and thickness of each layer is listed from the bottom to the top according to the stacking order, i.e., from the Ta layer in buffer layer 5 in contact with lower electrode/shield layer 4 to the Ru layer in cap layer 10 in contact with upper electrode/shield layer 3. In Table 1, expressions in the column under "composition" such as Co70Fe30 represent the atomic percent of each element.

In the stacked layer structure shown in Table 1, pinned layer 7 has a thickness of 10 nm, nonmagnetic spacer layer 8 has a thickness of 3 nm, and free layer 9 has a thickness of 7.2 nm. The total thickness of these functional layers is 20.2 nm, which is considerably larger as compared with an ordinary CIP-GMR or TMR sensor. The total thickness of pinned layer 7, nonmagnetic spacer layer 8, and free layer 9 is preferably at least about 10 nm in order to increase the bulk scattering effect and thereby to obtain a larger change in magnetoresistance.

TABLE 1

| Layer | | Composition | Thickness (nm) |
|---|---|---|---|
| Cap layer | | Ru | 5 |
| | | Cu | 3 |
| Free layer | | Co70Fe30 | 1 |
| | | Ni81Fe19 | 2 |
| | | Co70Fe30 | 0.5 |
| | | Cu | 0.2 |
| | | Co70Fe30 | 0.5 |
| | | Ni81Fe19 | 2 |
| | | Co70Fe30 | 1 |
| Nonmagnetic spacer layer | | Cu | 3 |
| Pinned layer | Second pinned layer | Co50Fe50 | 2.5 |
| | | Cu | 0.2 |
| | | Co50Fe50 | 2.5 |
| | Nonmagnetic spacer layer | Ru | 0.8 |
| | First pinned layer | Co70Fe30 | 4 |
| Anti-ferromagnetic layer | | IrMn | 7 |
| Buffer layer | | NiFeCr | 5 |
| | | Ta | 1 |

The configuration of the hard magnetic films will be described in detail with reference to FIG. 5. Hard magnetic films 12 are disposed on both side surfaces 19 of SV film 18 with insulating films 11 interposed therebetween. Side surfaces 19 of SV film 18 are formed on both sides in a direction parallel to air bearing surface 24 and perpendicular to stacked direction T in which the layers of SV film 18 are stacked. This direction is called layer width direction S hereinafter.

Insulating films 11, which are oxide films made of $Al_2O_3$, for example, are provided to prevent leakage of sense current 22 from SV film 18. Insulating film 11 is preferably formed as thin as possible while maintaining its insulating capability.

Hard magnetic films 12, which may be made of CoPt or CoCrPt, are magnetic domain control films for aligning the different magnetic orientations of the magnetic domains of free layer 9 into a single magnetic orientation. Hard magnetic films 12 are required to have sufficient thicknesses to stabilize the magnetic orientation of the magnetic domains of free layer 9. However, hard magnetic films 12 that are too thick generate an excessive biasing magnetic field, and this results in degraded magnetic response of free layer 9 and also results in reduction in the output level. In addition, the excessive biasing magnetic field undesirably reduces the magnetic response of upper electrode/shield layer 3 due to its magnetization, as well as changes the magnetic orientation of pinned layer 7. Thus, hard magnetic films 12 need to have suitable thicknesses.

Lower base layers 14, which are made of Cr or the like, are disposed between hard magnetic films 12 and insulating films 11 in order to enhance the magnetic characteristics of hard magnetic films 12. Similarly, cap layers 15 of hard magnetic layers 12 are formed between hard magnetic films 12 and upper electrode base layer 31.

Each hard magnetic film 12 has, in a plane parallel to air bearing surface 24, first boundary line 32 that faces free layer 9, second boundary line 33 that faces lower electrode/shield layer 4, and third boundary line 34 that faces side surface 19 of SV film 18 and interconnects first and second boundary lines 32, 33. These boundary lines 32-34 are not necessarily straight lines, but may have small bent points. Second boundary line 33 may be slightly inclined with respect to layer width direction S. By way of example, first boundary line 32 is inclined towards layer width direction S at an angle of about 78 degrees (P1 in FIG. 5), and third boundary line 34 is inclined towards layer width direction S at an angle of about 33 degrees (P2 in FIG. 5).

Figure 1:
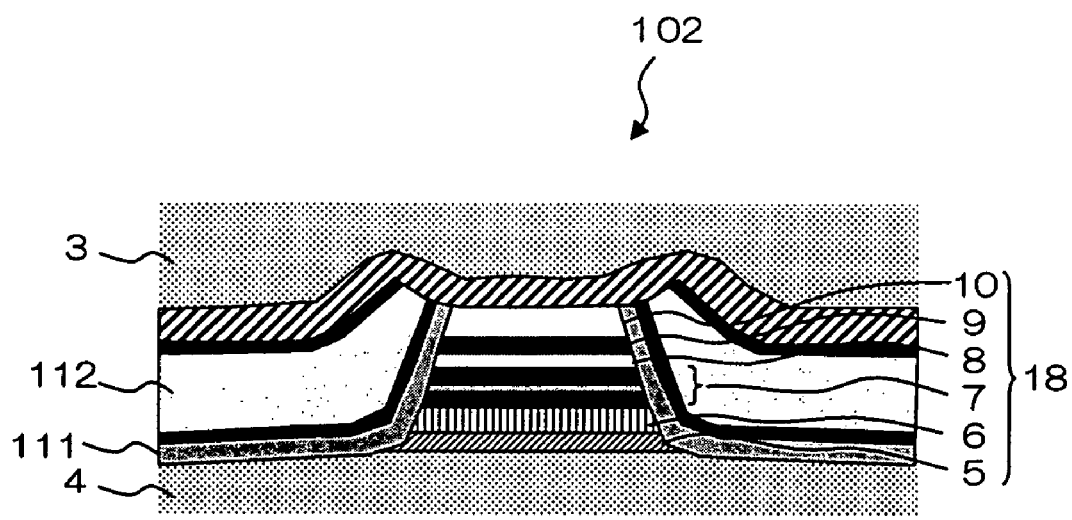
FIGS. 1 and 2 are side views of a conventional magnetoresistive effect sensor as viewed from an air bearing surface.
Figure 2:
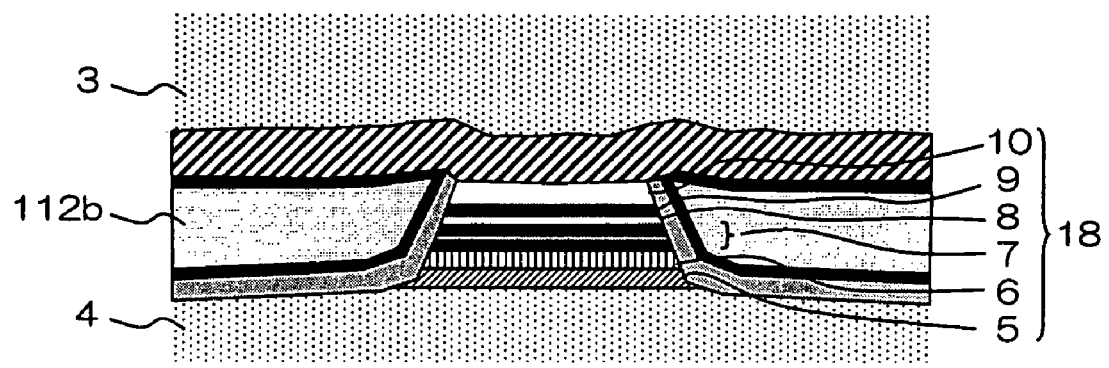

Upper end 35 of first boundary line 32 defines the upper crest of hard magnetic film 12. This means that, as compared with FIG. 1, no portion of hard magnetic film 12 projects from SV film 18. Hard magnetic film 12 so formed reduces leakage of the magnetic field into upper electrode/shield layer 3, thereby effectively applying the magnetic field to SV film 18.

In the vicinity of SV film 18, hard magnetic film 12 extends such that its cross-sectional area in a plane perpendicular to layer width direction S of SV film 18, that is, in a plane perpendicular to the sheet of FIG. 5, becomes progressively smaller toward SV film 18. As a result, hard magnetic film 12 can be formed in a sufficient thickness in portions remote from SV film 18, so that hard magnetic film 12 can supply necessary magnetic field intensity. An excessive biasing magnetic field can be easily avoided, because hard magnetic film 12 can be formed in an appropriate thickness and in a cross-sectional area in a less restrictive manner in the portions remote from SV film 18. Furthermore, since hard magnetic film 12 approaches SV film 18, extending toward free layer 9 with cross-sectional area being reduced, the magnetic field from hard magnetic layer 9 is concentrated on free layer 9. In other words, according to the present embodiment, hard magnetic film 12 has a shape such that as center 38 of gravity thereof approaches SV film 18, hard magnetic film 12 is oriented in upward stacking direction T1, or rises along SV film 18 toward free layer 9.

Upper end 35 of first boundary line 32 lies above upper surface 91 of free layer 9 in upward stacked direction T1, while bent point 36 between first boundary line 32 and third boundary line 34 lies below lower surface 92 of free layer 9 in downward stacked direction T2. This means that entire side surface 19 of free layer 9 faces first boundary line 32, allowing a sufficient magnetic field to be applied to free layer 9. Although bent point 36 is usually formed as a crossing point between first boundary line 32 and third boundary line 34, it may microscopically be in the form of a curved line interconnecting first boundary line 32 and third boundary line 34.

Figure 6:
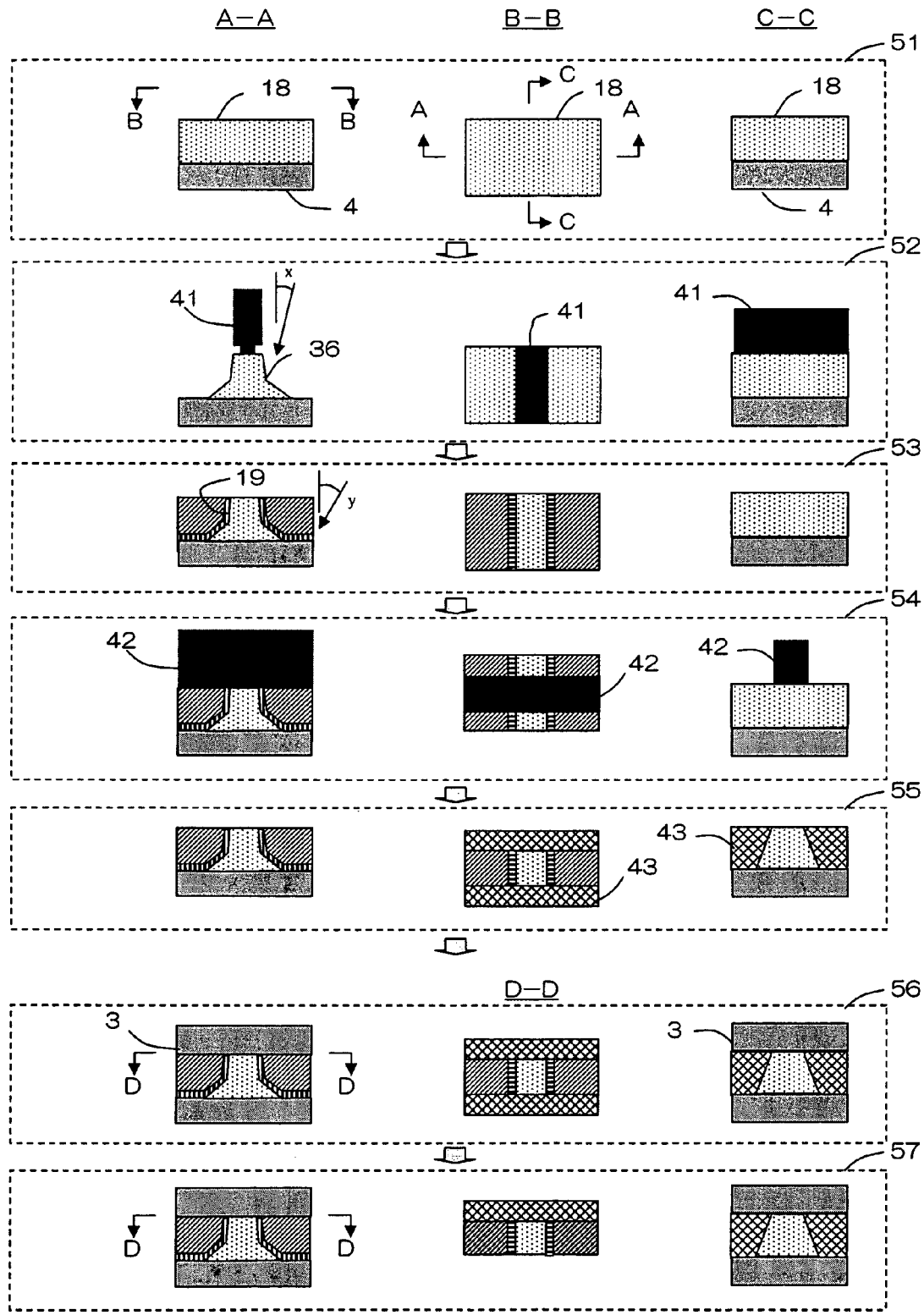
FIG. 6 is a view illustrating steps for fabricating the magnetoresistive effect sensor shown in FIG. 3.

FIG. 6 shows exemplary steps for manufacturing a magnetoresistive effect sensor according to the present invention. The manufacturing process will be described with respect to a CPP sensor of the structure as described above. In FIG. 6, a CPP sensor under fabrication is shown in cross-sectional views along the line A-A as seen from air bearing surface 24, in plan views along the line B-B which are replaced with plan views along the line D-D in some steps, and in cross-sectional views along the line C-C.

(Step 51) SV film 18 was deposited on lower electrode/shield layer 4, first.

(Step 52) SV film 18 was etched using photoresist 41 as a mask. As a wafer (not shown) with lower electrode/shield layer 4 formed thereon was rotated, ion beam was applied obliquely to the wafer at angle x of about 10 degrees to the axis of the wafer. In the vicinity of photoresist 41, SV film 18 is alternately irradiated with the ion beam and shielded from the ion beam by photoresist 41, producing bent point 36 on SV film 18. The position of bent point 36 can be adjusted by controlling the depth of milling. Specifically, if milling is finished at a shallower position, then bent point 36 is formed at a higher position, and if milling is performed to a deeper position, then bent point 36 is formed at a lower position. In the illustrated manufacturing process, SV film 18 was overmilled such that after the general portion thereof was etched away. Lower electrode/shield layer 4 was then also etched away by about 3 nm.

(Step 53) Thereafter, insulating films 11 and hard magnetic films 12 were formed, photoresist 41 was then removed. Insulating films 11, which were made of $Al_2O_3$ and had thicknesses of 8 nm, were deposited by ion beam sputtering. Sputtering particles were obliquely applied at angle y of about 40 degrees to the axis of the wafer so that they could be deposited to about the same thickness as the thickness on the bottom surface, on side surfaces 19 of SV film 18 which are relatively sharply inclined. The thickness was measured perpendicularly to first boundary line 32. Hard magnetic films 12, which were made of CoCrPt, had thicknesses of 30 nm in general portions remote from SV film 18. Base layers 14 consisting of Cr sensors having thicknesses of 2 nm were also formed in this step.

(Step 54) Photoresist 42 was deposited in order to form the rear end portion of SV film 18.

(Step 55) SV film 18 was etched using photoresist 42 as a mask, insulating film 43 was then deposited in the etched area. The sides of SV film 18 on the air bearing surface and opposite to the air bearing surface were replaced with insulating film 43.

(Step 56) Upper electrode/shield layer 3 was formed on the stacked layers.

(Step 57) Finally, SV film 18 was lapped from the side of the air bearing surface in order to form its predetermined MR height.

Next, in order to confirm the advantageous effect of the present invention, an sample according to the present invention and two comparative samples each having a bent point at a different position were compared with each other. The bent points were formed at different positions by changing the position at which the etching was stopped. In each sample, the hard magnetic films were formed to the thicknesses shown in the above description of the manufacturing process. The sense current upon measurement was set to 5 mA.

As evaluation items, the output power of the isolated read pulse, the deviation of asymmetry of the output reproduced wave (referred to as asymmetrical deviation in the table and below), and the probability of occurrence of Barkhausen noise, in which the value for the inventive sample was normalized to 1, were selected. As the value of the asymmetrical deviation, which was determined from the measured data of 30 elements, increases, the linearity of the response to the magnetic field is degraded and the variation of the response between elements is increased. The reason that the asymmetrical deviation and the probability of occurrence of Barkhausen noise were selected is that these evaluation items indicate the stability of reproduction, and that the object of the present invention is to obtain a linear magnetic response to a signal magnetic field by applying magnetic field from the hard magnetic films effectively to the free layer. The results are shown in Table 2 below.

TABLE 2

|  | Inventive sample | Comparative sample 1 | Comparative sample 2 |
| --- | --- | --- | --- |
| Location of bent point | Second pinned layer 73 | Cap layer 10 | Anti-ferromagnetic layer 6 |
| Output power(mV) | 0.9 | 1.04 | 0.98 |
| Asymmetrical deviation (%) | 13 | 30 | 26 |
| Probability of occurrence of Barkhausen noise | 1 | 2.8 | 2.2 |

It was confirmed from Table 2 that the output power of comparative samples 1, 2 was rather greater than that of the inventive sample. This is because that higher output power tends to be achieved in ineffective hard magnetic films as compared to sufficiently effective hard magnetic films, in which the linearity of the magnetic response of the free layer may be improved while the output power may be rather decreased.

It was also confirmed that the inventive sample reduced asymmetrical deviation and the probability of occurrence of Barkhausen noise, and accordingly that the magnetic field from the hard magnetic films was effectively applied to the free layer in the inventive sample, and, judging from the evaluation items as a whole, the inventive sample exhibited better reproduction characteristics than the comparative examples 1, 2.

Figure 7:
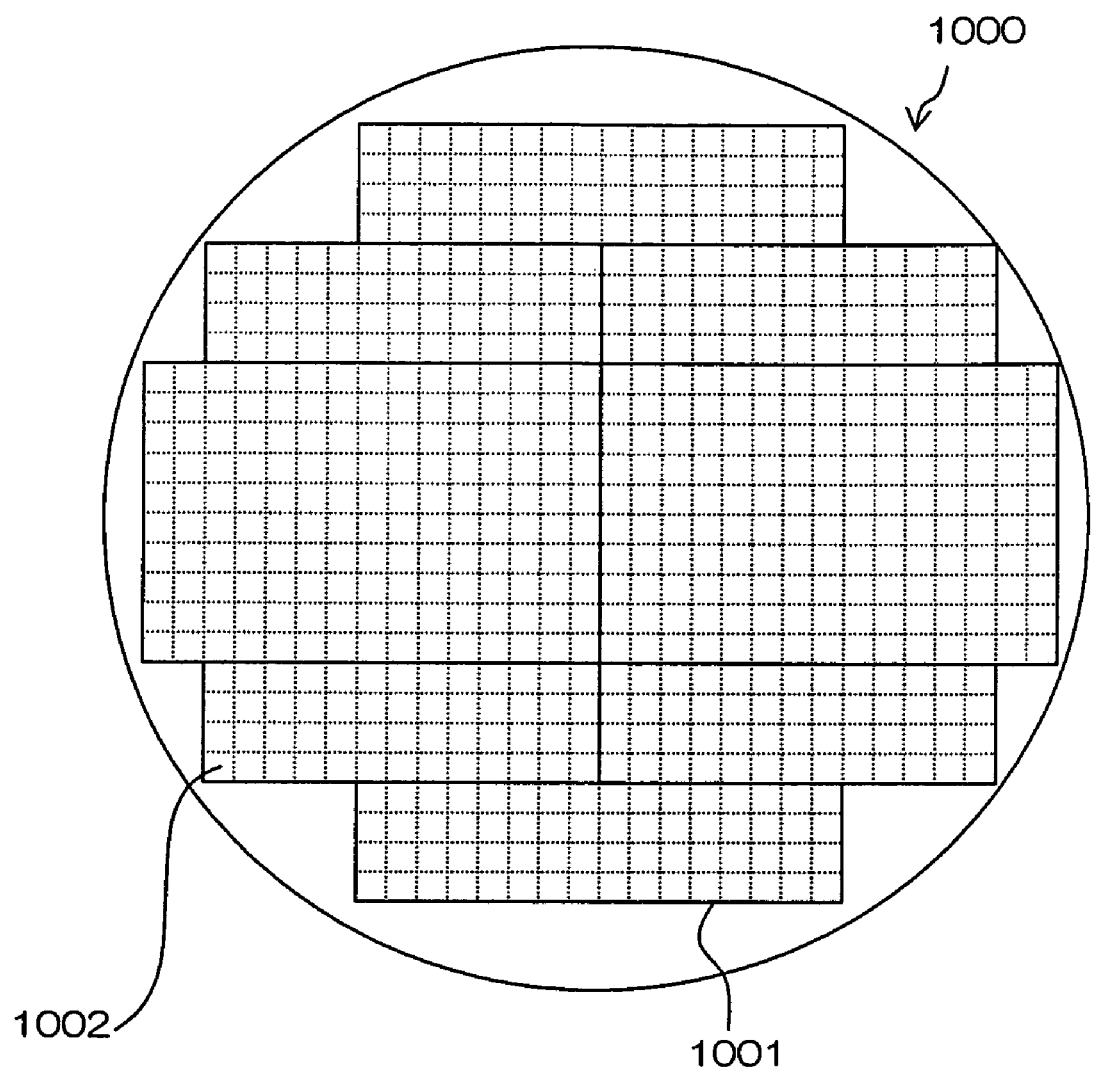
FIG. 7 is a plan view of a wafer associated with the manufacturing of a thin-film magnetic head which incorporates a magnetoresistive effect sensor according to the present invention.

Next, explanation regards a wafer for fabricating the above-described thin-film magnetic head. FIG. 7 is a schematic plan view of the wafer. Wafer 1000 is partitioned into a plurality of thin-film magneto-electric transducer assemblies 1001. Each thin-film magneto-electric transducer assembly 1001 includes thin-film magneto-electric transducers 1002, in each of which at least layers 3-9 are stacked, and serves as a work unit in the polishing process of the ABS. Cut margins (not shown) are provided for cutting between thin-film magneto-electric transducer assemblies 1001 and between thin-film magneto-electric transducers 1002.

Figure 8:
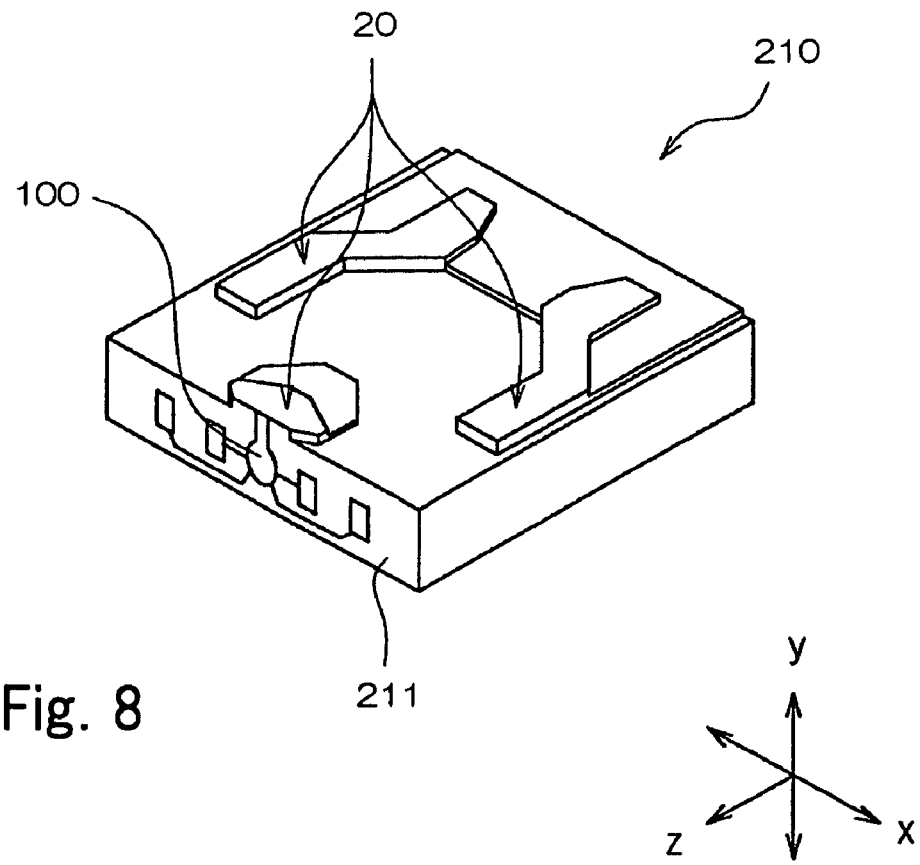
FIG. 8 is a perspective view illustrating a slider included in a head gimbal assembly which incorporates a magnetoresistive effect sensor according to the present invention.

Explanation next regards a head gimbal assembly and a hard disk device having CPP sensor 2 as a head sensor. Referring to FIG. 8, explanation is first presented regarding slider 210 included in the head gimbal assembly. In the hard disk device, slider 210 is arranged opposite to a hard disk, which is a rotarily-driven disciform storage medium. Slider 210 is provided with body 211 mainly formed of substrate 1 and overcoat layer 17 shown in FIG. 8. Body 211 has a substantially hexahedral form. One surface of the six surfaces of body 211 is positioned opposite to the hard disk, with air bearing surface 20 being formed on the surface. When the hard disk rotates moving in the z direction in FIG. 8, the airflow that passes between the hard disk and slider 210 creates a dynamic lift, which is applied to slider 210 downward in the y direction of FIG. 8. Slider 210 is lifted away from the surface of the hard disk by this dynamic lift. For reference, the x direction in FIG. 8 is the transverse direction of the track of the hard disk. In the proximity to the trailing edge of slider 210 on the outlet side of the airflow (the end portion at the lower left in FIG. 8), thin-film magnetic head 100 is formed, with CPP sensor 2 employed as a head sensor.

Figure 9:
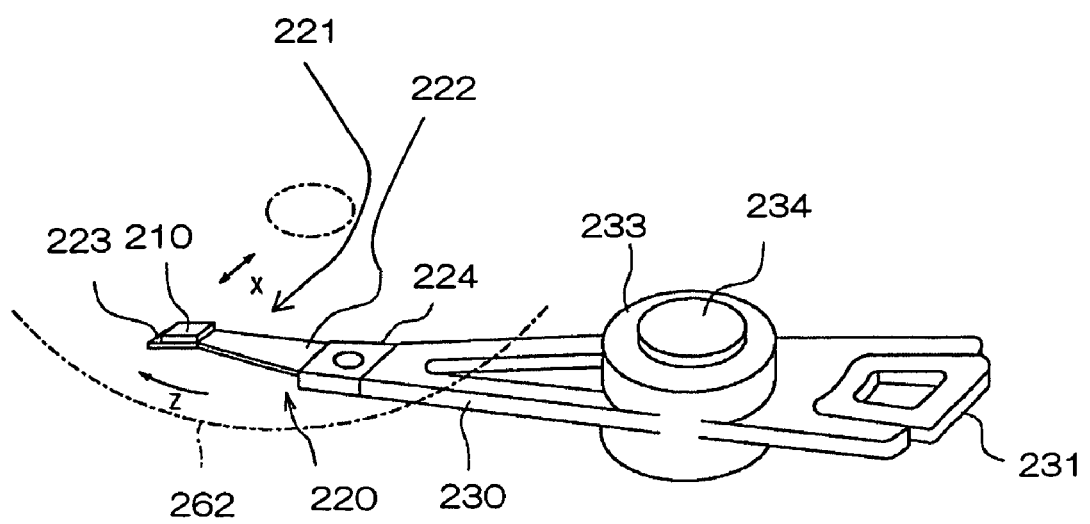
FIG. 9 is a perspective view illustrating a head arm assembly including the head gimbal assembly which incorporates a magnetoresistive effect sensor according to the present invention.

Referring to FIG. 9, explanation is next presented regarding head gimbal assembly having CPP sensor 2 employed as a head sensor. Head gimbal assembly 220 is provided with slider 210 and suspension 221 for resiliently supporting slider 210. Suspension 221 has; load beam 222 in a shape of flat spring and made of, for example, stainless steel; flexure 223 attached to one end of load beam 222, and to which slider 210 is fixed, while providing appropriate degree of freedom to slider 210; and base plate 224 provided in the other end of load beam 222. Base plate 224 is adapted to be attached to arm 230 of the actuator for moving slider 210 in the transverse direction of the track of the hard disk 262. The actuator is provided with arm 230 and a voice coil motor for driving arm 230. The portion of the flexure to which slider 210 is attached is provided with a gimbal section for maintaining a constant posture of slider 210.

Head gimbal assembly 220 is attached to arm 230 of the actuator. The arrangement having a head gimbal assembly attached to a single arm is called a head arm assembly.

The arrangement having head gimbal assemblies attached to respective arms of a carriage having a plurality of arms is called a head stack assembly. FIG. 9 illustrates an example of a head arm assembly, in which head gimbal assembly 220 is attached to one end of arm 230. To the other end of arm 230, there is attached coil 231, which makes a part of a voice coil motor. In the intermediate portion of arm 230, bearing section 233 is provided to fit on shaft 234 for rotatably holding arm 230.

Figure 10:
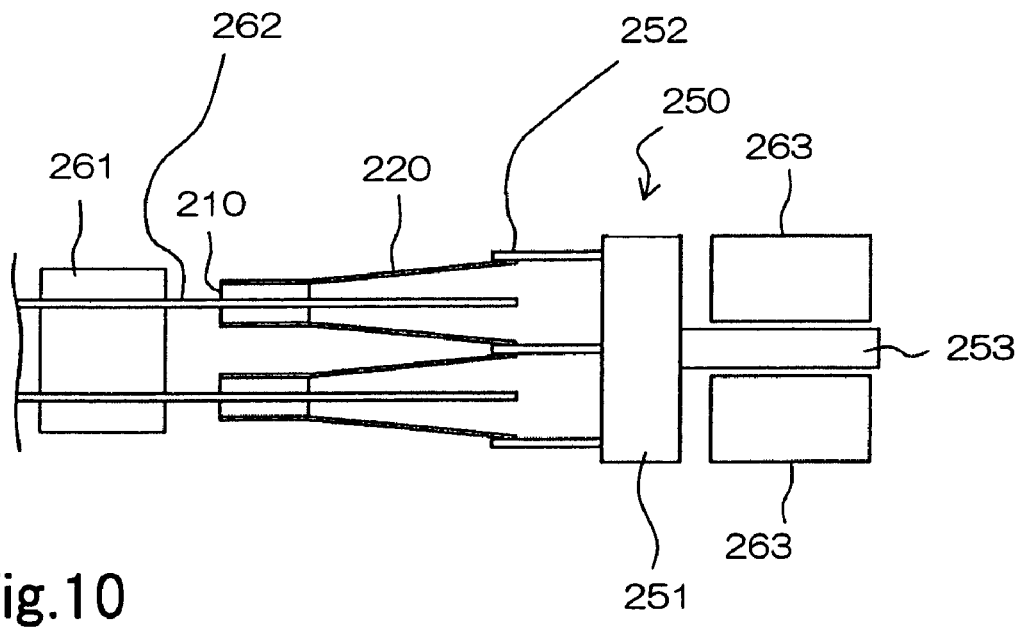
FIG. 10 is an explanatory diagram illustrating an essential part of a hard disk device which incorporates a magnetoresistive effect sensor according to the present invention.
Figure 11:
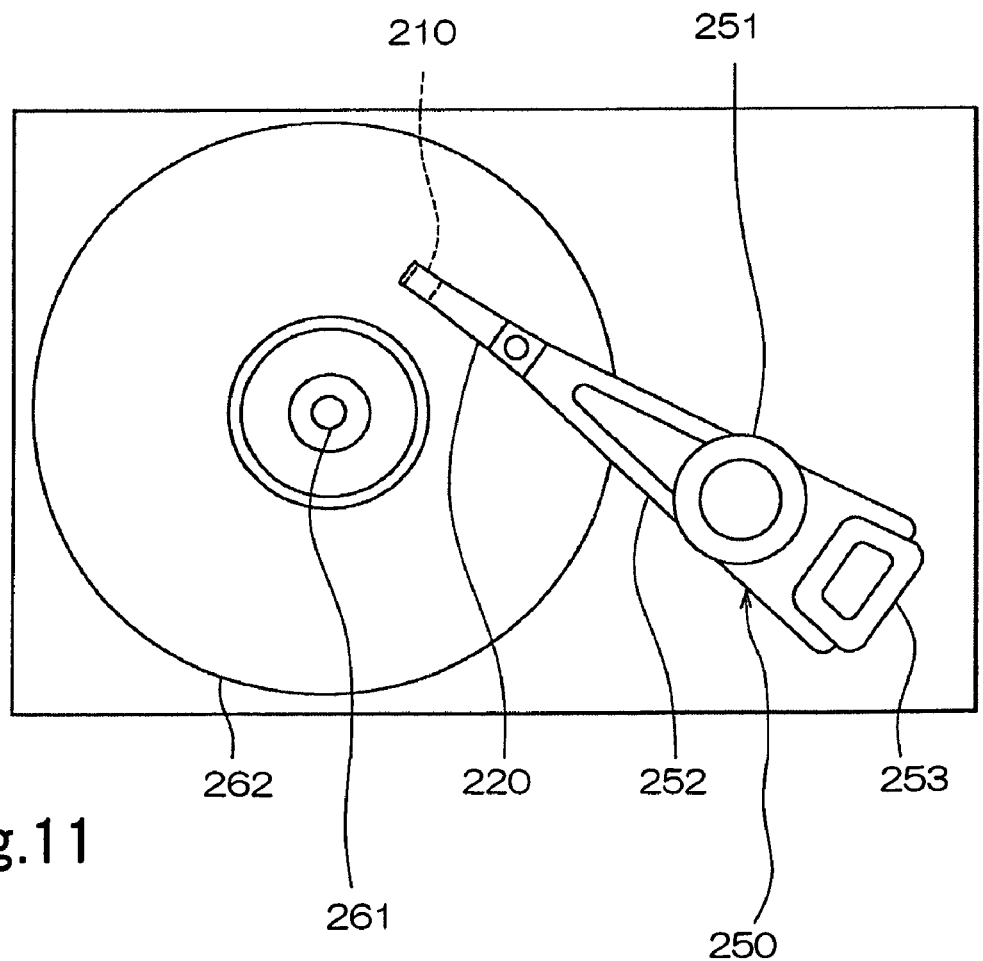
FIG. 11 is a plan view of a hard disk device which incorporates a magnetoresistive effect sensor according to the present invention.

Referring to FIG. 10 and FIG. 11, explanation is next presented regarding the head stack assembly and the hard disk device employing CPP sensor 2 as a head sensor. FIG. 10 is an explanatory diagram illustrating an essential part of the hard disk device, and FIG. 11 is a plan view of the hard disk device. Head stack assembly 250 has carriage 251 provided with a plurality of arms 252. A plurality of head gimbal assemblies 220 are attached to a plurality of arms 252. Head gimbal assemblies 220 is aligned spaced apart from each other in the vertical direction. Coil 253, which is a part of the voice coil, is attached to carriage 251 at the opposite side to arms 252. Head stack assembly 250 is installed in the hard disk device, which has a plurality of hard disks connected to spindle motor 261. Two sliders for each hard disk 262 are arranged in opposed positions interposing hard disk 262. The voice coil motor has permanent magnets 263 arranged in opposed positions interposing coil 253 of head stack assembly 250.

Head stack assembly 250 and the actuator, except for sliders 210, work as a locating device, carrying the sliders 210 and operating to locate sliders 210 relative to hard disks 262.

The hard disk device moves sliders 210 in the transverse directions of the tracks of hard disks 262 by the actuator, and locates sliders 210 relative to hard disks 262. The thin-film magnetic head contained in slider 210 records information to hard disk 262 through a write head, and also reads information recorded in hard disk 262 through a read head in which CPP sensor 2 is employed as a magnetic head.

Although a certain preferred embodiments of the present invention have been shown and described in detail, it should be understood that various changes and modifications may be made without departing from the spirit or scope of the appended claims.

What is claimed is:

1. A magnetoresistive effect sensor comprising:
a spin valve film disposed on a substrate layer, the spin valve film comprising a stacked layer structure which includes a pinned layer having a fixed magnetic orientation against an external magnetic field, a nonmagnetic spacer layer, and a free layer having a variable magnetic orientation which depends on the external magnetic field,
wherein sense current flows through the pinned layer, the nonmagnetic spacer layer, and the free layer substantially in a stacked direction thereof, and
wherein the pinned layer, the nonmagnetic spacer layer, and the free layer have a total thickness of at least 10 nm;
insulating films disposed on both side surfaces of the spin valve film in a layer width direction, the layer width direction being parallel to an air bearing surface and perpendicular to the stacked direction; and
hard magnetic films disposed on die insulating films for applying a biasing magnetic field to the free layer,
wherein each hard magnetic film extends toward the free layer in a vicinity of the spin valve film, such that as each hard magnetic film extends toward the spin valve film, a cross-sectional area thereof in a plane perpendicular to the layer width direction becomes progressively smaller,
wherein each hard magnetic film has, in a plane parallel to the air bearing surface, a first boundary line which at least partially faces the free layer and substantially defines an end point of the hard magnetic film in the layer width direction,
wherein each hard magnetic film has:
a second boundary line which feeds the substrate layer in the plane parallel to the air bearing surface; and
a third boundary line which faces the side surface of the spin valve film and interconnects the first and second boundary lines, and
wherein the first boundary line has an upper end which lies above an upper surface of the free layer in the stacked direction, and a bent point which lies between the first boundary line and the third boundary line, the bent point lying below a lower surface of the free layer in the stacked direction.

2. The magnetoresistive effect sensor according to claim 1, wherein each first boundary line has an upper end in the stacked direction, the upper end defining an upper crest of the hard magnetic film in the stacked direction.

3. The magnetoresistive effect sensor according to claim 1, wherein each hard magnetic film extends toward the free layer, so that as a centerline of the hard magnetic film in the plane perpendicular to the layer width direction approaches the spin valve film, each hard magnetic film extends upwardly in the stacked direction toward the free layer.

4. The magnetoresistive effect sensor according to claim 1, further comprising:
base films which are disposed between the hard magnetic films and the insulating films.

5. The magnetoresistive effect sensor according to claim 1, further comprising a lower base layer between the hard magnetic films and the insulating films, wherein the lower base layers comprise chromium.

6. The magnetoresistive effect sensor according to claim 1, wherein an entire side surface of the free layer faces the first boundary line.

7. A thin-film magnetic head having a magnetoresistive effect sensor, the magnetoresistive effect sensor comprising;
a spin valve film, disposed on a substrate layer, the spin valve film comprising a stacked layer structure which includes a pinned layer having a fixed magnetic orientation against an external magnetic field, a nonmagnetic spacer layer, and a free layer having a variable magnetic orientation which depends on the external magnetic field,
wherein sense current flows through the pinned layer, the nonmagnetic spacer layer, and the free layer substantially in a stacked direction thereof, and
wherein the pinned layer, the nonmagnetic spacer layer, and the free layer have a total thickness of at least 10 nm;
insulating films disposed on both side surfaces of the spin valve film in a layer width direction, the layer width direction being parallel to an air bearing surface and perpendicular to the stacked direction; and
hard magnetic films disposed on the insulation films for applying biasing magnetic field to the free layer,
wherein each hard magnetic film extends toward the free layer in a vicinity of the spin valve film, such that as each hard magnetic film extends toward the spin valve film, a cross-sectional area thereof in a plane perpendicular to the layer width direction becomes progressively smaller,
wherein each hard magnetic film has, in a plane parallel to the air bearing surface, a first boundary line which at least partially faces the free layer and substantially defines an end point of the hard magnetic film in the layer width direction,
wherein each hard magnetic film has:
a second boundary line which faces the substrate layer in the plane parallel to the air bearing surface; and
a third boundary line which faces the side surface of the spin valve film and interconnects the first and second boundary lines,
wherein the first boundary line has an upper end which lies above an upper surface of the free layer in the stacked direction, and bent point which lies between the first boundary line and the third boundary line, the bent point lying below a lower surface of the free layer in the stacked direction, and
wherein the first boundary line has an upper end which lies above an upper surface of the free layer in the stacked direction, and a bent point which lies between the first boundary line and the third boundary line, the bent point laying below a lower surface of the free layer in the stacked direction, and wherein the magnetoresistive effect sensor located on the air bearing surface to read data recorded in a medium.

8. A head gimbal assembly, comprising:

a slider including thin film magnetic head having a magnetoresistive effect sensor, the magnetoresistive effect sensor comprising:

a spin valve film disposed on a substrate layer, the spin valve film comprising a stacked later structure which includes a pinned layer having a fixed magnetic orientation against an external magnetic field, a nonmagnetic spacer layer, and a free layer having a variable magnetic orientation which depends on the external magnetic field, wherein sense current flows through the pinned layer, the nonmagnetic spacer layer, and the free layer substantially in a stacked direction thereof, and wherein the pinned layer, the nonmagnetic spacer layer, and the free layer have a total thickness of at least 10 nm;

insulating films disposed on both side surfaces of the spin valve film in a layer width direction, the layer width direction being parallel to an air bearing surface and perpendicular to the stacked direction; and hard magnetic films disposed on the insulating films for applying a biasing magnetic field to the free layer, wherein each hard magnetic film extends toward the free layer in a vicinity of the spin valve film, such that as each hard magnetic film extends toward the spin valve film, a cross-sectional area thereof in a plane perpendicular to the layer width direction becomes progressively smaller, wherein each hard magnetic film has, in a plane parallel to the air bearing surface, a first boundary line which at least partially faces the free layer and substantially defines an end point of the hard magnetic film in the layer width direction, wherein each hard magnetic film has:

a second boundary line which faces the substrate layer in the plane parallel to the air bearing surface; and a third boundary line which faces the side surface of the spin valve film and interconnects the first and second boundary lines, wherein the first boundary line has an upper end which lies above an upper surface of the free layer in the stacked direction, and a bent point which lies between the first boundary line and the third boundary line, the bent point lying below a lower surface of the free layer in the stacked direction, and wherein the magnetoresistive effect sensor is located on the air bearing surface to read data recorded in a recording medium, wherein the slider is located opposite to the recording medium; and a suspension for resiliently supporting the slider.

9. A hard disk device comprising:

a slider including a thin-film magnetic head having a magnetoresistive effect sensor, the magnetoresistive effect sensor comprising:

a spin valve film disposed on a substrate layer, the spin valve film comprising a stacked layer structure which includes a pinned layer having a fixed magnetic orientation against an external magnetic field, a nonmagnetic spacer layer, and a free layer having a variable magnetic orientation which depends on the external magnetic field, wherein sense current flows through the pinned layer, nonmagnetic spacer layer, and the free layer substantially in a stacked direction thereof and wherein the pinned layer, nonmagnetic spacer layer, and the free layer have a total thickness of at least 10 nm;

insulating films disposed on both side surfaces of the spin valve film in a layer width direction, the layer width direction being parallel to an air bearing surface and perpendicular to the stacked direction; and hard magnetic films disposed on the insulating films for applying a biasing magnetic field to the free layer, wherein each hard magnetic film extends toward the free layer in a vicinity of the spin valve film, such that as each hard magnetic film extends toward the spin valve film, cross-sectional area thereof in plane perpendicular to the width direction becomes progressively smaller, wherein each hard magnetic film has, in a plane parallel to the air bearing surface, a first boundary line which at least partially faces the free layer and substantially defines an end point of the hard magnetic film in the layer width direction, wherein each hard magnetic film has:

a second boundary line which faces the substrate layer in the plane parallel to the air bearing surface; and a third boundary line which faces the side surface of the spin valve film and interconnects the first and second boundary lines, wherein the first boundary line has an upper end which lies above an upper surface of the free layer in the stacked direction, and a bent point which lies between the first boundary line and the third boundary line, the bent point lying below a lower surface of the free layer in the slacked direction, and wherein the magnetoresistive effect sensor is located on the air bearing surface to read data recorded in a recording medium, wherein the slider is located opposite to a disciform recording medium driven to rotate; and a positioning device for supporting the slider and positioning the slider relative to the recording medium.

* * * * *